(12) United States Patent
Johnson

(10) Patent No.: US 7,066,703 B2
(45) Date of Patent: Jun. 27, 2006

(54) CHUCK TRANSPORT METHOD AND SYSTEM

(75) Inventor: Wayne L. Johnson, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/247,561

(22) Filed: Sep. 20, 2002

(65) Prior Publication Data

US 2003/0035705 A1 Feb. 20, 2003

Related U.S. Application Data

(63) Continuation of application No. PCT/US01/05820, filed on Mar. 20, 2001.

(60) Provisional application No. 60/190,099, filed on Mar. 20, 2000, provisional application No. 60/190,098, filed on Mar. 20, 2000, provisional application No. 60/190,096, filed on Mar. 20, 2000, provisional application No. 60/156,595, filed on Sep. 29, 1999.

(51) Int. Cl.
*H01L 21/677* (2006.01)

(52) U.S. Cl. .................. 414/217; 414/149; 414/222.01; 414/222.13; 414/223.01; 414/804; 414/805; 414/939

(58) Field of Classification Search ................ 414/217, 414/222.03, 222.09, 222.13, 223.01, 939, 414/149, 222.01, 223.02, 804, 805
See application file for complete search history.

(56) References Cited

U.S. PATENT DOCUMENTS

| 4,886,592 | A | | 12/1989 | Anderle et al. |
| 5,183,547 | A | * | 2/1993 | Ikeda .................... 204/298.25 |
| 6,048,154 | A | * | 4/2000 | Wytman .................... 414/217 |
| 6,203,677 | B1 | * | 3/2001 | Konig .................... 204/298.7 |
| 6,270,582 | B1 | * | 8/2001 | Rivkin et al. ............... 118/719 |

FOREIGN PATENT DOCUMENTS

| DE | 197 42 923 A1 | 4/1999 |
| EP | 0 905 275 | 3/1999 |

* cited by examiner

*Primary Examiner*—Eileen D. Lillis
*Assistant Examiner*—Michael Lowe
(74) *Attorney, Agent, or Firm*—Oblon, Spivak, McClelland, Maier & Neustadt, P.C.

(57) ABSTRACT

A method and system for transporting a plurality of substrates between a transfer chamber and at least one processing chamber. The system includes a chuck assembly with a plurality of chucks configured to receive wafer substrates, where the chuck assembly is movably configured to provide for transfer of the plurality of substrates between a transfer chamber and a processing chamber. The system provides a structure that allows for the processing of one substrate on a first chuck, while a second substrate is loaded onto a second chuck and prepared for processing.

16 Claims, 10 Drawing Sheets

CHUCK TRANSPORT METHOD AND SYSTEM

CROSS-REFERENCE TO RELATED APPLICATIONS

This application is a continuation of International application serial no. PCT/US01/05820, filed on Mar. 20, 2001, which was published in English, which claims priority to U.S. provisional application Ser. No. 60/190,096, filed on Mar. 20, 2000, and the entire contents of both of those applications are herein incorporated by reference. This application is also related to the following applications: U.S. provisional application Ser. No. 60/156,595, entitled "Multi-Zone Resistance Heater," filed on Sep. 29, 1999; International application serial no. PCT/US 98/23248, entitled "All RF Biasable and/or Surface Temperature Controlled ESRF," filed Nov. 13, 1998; U.S. provisional application Ser. No. 60/190,098, entitled "High Speed Stripping for Damaged Photoresist," filed on Mar. 20, 2000; U.S. provisional application Ser. No. 60/190,099, entitled "High Speed Photoresist Stripping Chamber," filed on Mar. 20, 2000. Each of those applications is incorporated herein by reference in its entirety.

BACKGROUND OF THE INVENTION

1. Field of the Invention

The present invention relates generally to moving substrates between processing chambers, and more specifically, to a method and system for transporting a plurality of substrates between a transfer chamber and at least one processing chamber.

2. Discussion of the Background

Commercial wafer processing systems are very expensive. Many wafer processing systems process a wafer by (1) transferring a wafer from a wafer cassette to a processing chamber, (2) processing the wafer, (3) returning the wafer to the cassette, and repeating steps (1)–(3). In the field of wafer processing, overhead time is time the processing chamber does not spend processing wafers (e.g., the time utilized to transport a substrate from a cassette to a processing chamber and back after completion of the processing steps). The more overhead time, the less "throughput" a system will be capable of achieving. In other words, the more time the processing chamber remains idle, the lower the total number of substrates that will be processed within a given time period.

In general, the overall cost of processing a wafer substrate is most influenced by two factors, i.e., (1) the throughput of the system and (2) the cost to purchase or build the system. In order to reduce the overall cost of processing a wafer, those factors must be optimized. As a result, system users attempt to recoup their investment in the cost of the system by processing as many wafers per system per day as possible. In many processes, however, overhead steps (e.g., transferring the substrate from the cassette to the processing chuck, clamping the substrate to the processing chuck, testing the clamping of the substrate in the processing chuck, performing any pre-processing steps, and transferring the processing chuck to the processing chamber) require a significant period of time during which the processing chamber is inactive. Therefore, a system is needed that increases the throughput of a wafer processing system by reducing the amount of time the processing chamber is inactive.

The industry continually pushes to decrease cost of processing wafers. Without complete shifts in the methods wafers are processed, each new generation of equipment is required to be more capable thus increasing equipment cost. The equipment designer can only increase throughput to make significant changes in processing cost.

SUMMARY OF THE INVENTION

Accordingly, the present invention provides a method and system including a chuck transport system for transporting plural substrates between a transfer chamber and at least one processing chamber, thereby increasing the throughput of a substrate processing system by decreasing the amount of time that the processing chamber remains inactive.

The present invention further provides a configuration of chucks that are exchanged in chambers to improve system throughput and reduce the run time on chucks thus extending their lifetime.

The system of the present invention provides a structure that allows a first chuck to position a first substrate within a processing chamber for processing while a second chuck is positioned in a transfer chamber. A second processed substrate is unloaded and a new unprocessed third substrate is loaded onto the second chuck and prepared for processing while the first substrate is being processed. The present invention includes a chuck transport system having a chuck assembly with plural chucks configured to receive substrates, where the chuck assembly is movably configured to provide for transfer of the plural substrates between a transfer chamber and a processing chamber.

One embodiment of the chuck transport system includes a chuck assembly rotatably supported within a transport chamber by a shaft, where the shaft is also slidably mounted such that the chuck assembly can be linearly actuated in a vertical manner within the transport chamber. The chuck assembly has a first chuck and a second chuck mounted thereon that are each configured to receive a substrate. The chuck transport system is configured to position the first and second chucks in a processing position and a substrate exchange position, respectively. When a chuck is positioned in the processing position the substrate is sealed within a processing chamber such that the substrate can be processed within a controlled environment of an interior of the processing chamber. When a chuck is positioned in the substrate exchange position the substrate is sealed within the transfer chamber such that the substrate can be loaded or unloaded from the chuck by a transfer arm.

BRIEF DESCRIPTION OF THE DRAWINGS

A more complete appreciation of the invention and many of the attendant advantages thereof will become readily apparent with reference to the following detailed description, particularly when considered in conjunction with the accompanying drawings, in which.

DESCRIPTION OF THE PREFERRED EMBODIMENTS

Figure 1A:
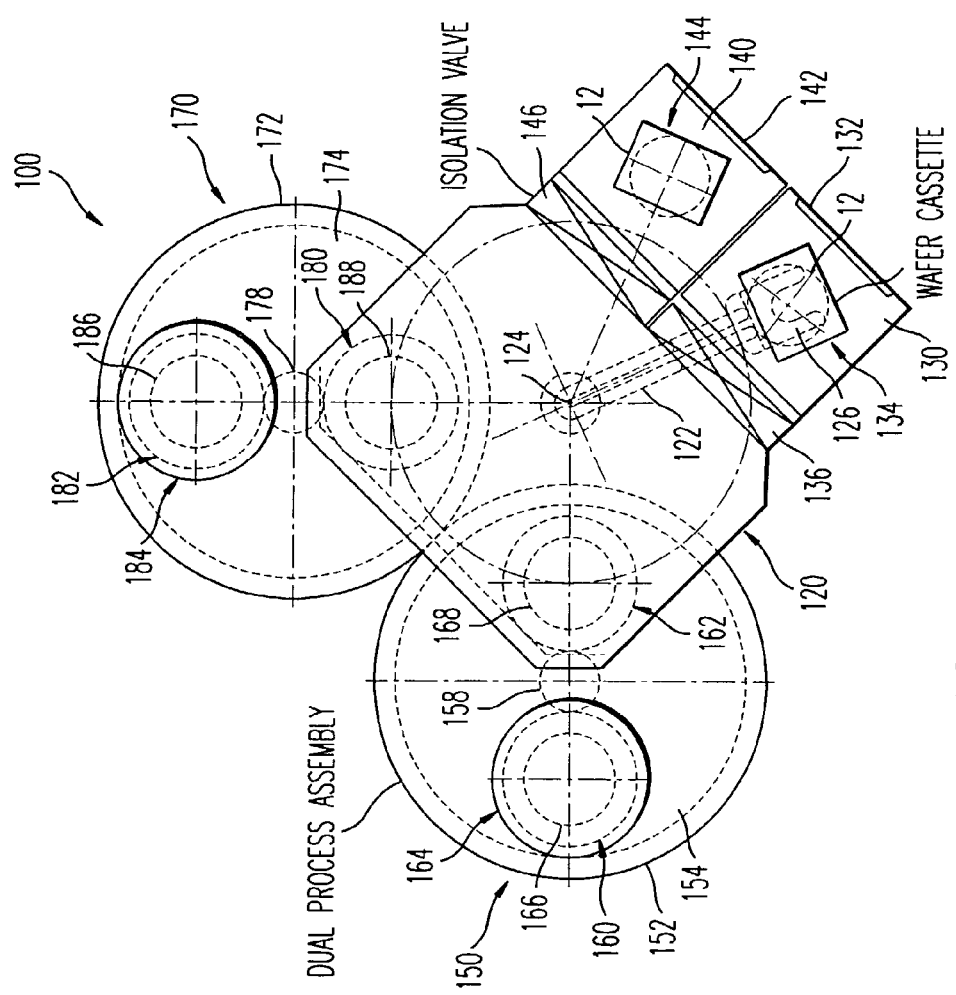
FIG. 1A is a top view of a substrate processing system incorporating a first embodiment of a chuck transport system of the present invention.
Figure 1B:
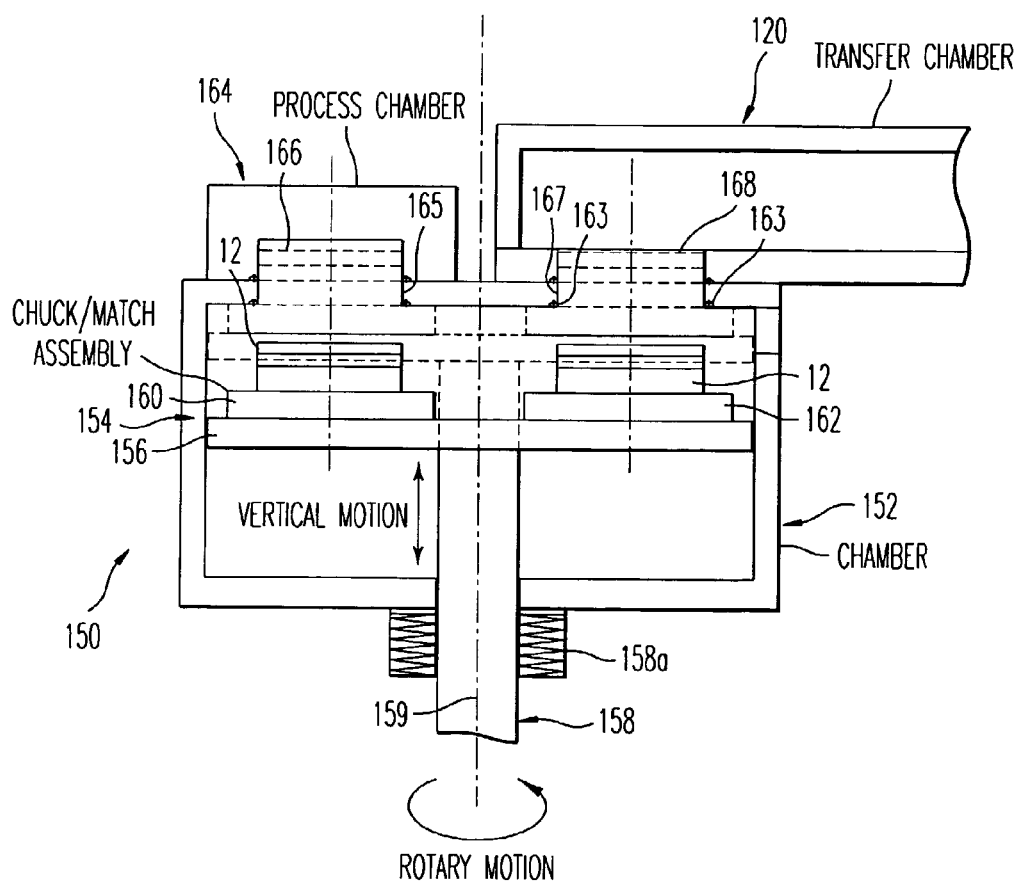
FIG. 1B is a cross-sectional view of the first embodiment of the chuck transport system of FIG. 1A.

Referring now to the drawings, FIGS. 1A and 1B depict a first exemplary embodiment of a wafer substrate processing system 100 according to the present invention. The system 100 generally includes a load lock chamber or a transport chamber 120, a first cassette platform or a loading platform 130, a second cassette platform or an unloading (They are usually loaded and unloaded into the same slot in the same cassette. Two load locks are provided so that the time for the load lock to pump down and be well purged does not interrupt processing. For example, the first cassette platform may be pumped down and purged, and periodically a finished substrate is deposited and another substrate is retrieved. The second cassette, however, may be at atmospheric pressure and opened to the operator in order to exchange cassettes. In this manner, the isolation valve for the first cassette platform may be opened once the cassette platform has been purged and its pressure is equilibrated with the pressure in the transfer chamber. The valve may remain open while wafers are exchanged. Conversely, the isolation valve to the second cassette platform remains closed since the cassette platform is at atmospheric pressure.) platform 140, a first chuck transport system 150 connected to a first processing chamber 164, and a second chuck transport system 170 connected to a second processing chamber 184. The first chuck transport system 150 includes a chuck assembly 154 that is configured to carry a first chuck 160 and a second chuck 162. Similarly, the second chuck transport system 170 includes a chuck assembly 174 that is configured to carry a first chuck 180 and a second chuck 182.

A robotic transfer arm 122 is pivotally provided about an axis 124 in the transfer chamber 120. The transfer arm 122 can be either an articulated arm having two or more segments or an arm having only one segment depending on the configuration of the transfer chamber 120, the first cassette platform 130, and the second cassette platform 140. The transfer arm 122 has a blade 126 that is configured to engage and carry a wafer substrate 12.

The first cassette platform 130 and the second cassette platform 140 have openings 132 and 142, respectively, that allow wafer cassettes 134 and 144 to be inserted and temporarily stored or housed therein. The first cassette platform 130 and the second cassette platform 140 have isolation valves 136 and 146, respectively, that separate the first and second cassette platforms 130 and 140 from the transfer chamber 120. The isolation valves 136 and 146 can be opened to allow the transfer arm 122 to move within the first and/or second cassette platforms 130 and 140 and remove or replace a substrate 12 from the wafer cassettes 134 and 144. The isolation valves 136 and 146 (are opened once the load lock as been properly purged, evacuated and brought to the same pressure as the transfer room. Repeated opening of the valves is eliminated as are the attendant particulates) seal off the transfer chamber 120 once the transfer arm 122 is moved within the transfer chamber 120, thereby allowing the atmosphere within the transfer chamber 120 to be controlled using various gas supply and exhaust lines (not depicted). Heating or cooling mechanisms can be installed in the transfer chamber 120 in order to further control the atmosphere therein.

The first embodiment of the present invention depicted in FIGS. 1A and 1B includes a first chuck transport system 150 and a second chuck transport system 170 that are configured for transporting a plurality of substrates 12 between the transfer chamber 120 and processing chambers 164 and 184, respectively. As the first chuck transport system 150 and the second chuck transport system 170 are similar in structure, only the first chuck transport system 150 will be discussed in detail.

The chuck transport system 150 includes a chuck assembly 154 including a base 156 supported within a transport chamber 152 by a shaft 158. Vacuum integrity for the chuck transport chamber 152 is maintained via vacuum seal 158a, wherein the vacuum seal 158a may be a Ferrofluidic® bearing or O-ring seal. The chuck assembly 154 is rotatably supported within the transport chamber 152 by shaft 158 about an axis 159, and the shaft 158 is also slidably mounted such that the chuck assembly 154 can be linearly actuated in a vertical manner within the transport chamber 152. FIG. 1B depicts the chuck assembly 154 in solid lines at a lowered position and in dashed lines at an elevated position. The shaft 158 is supported and actuated by a conventional motor assembly (not depicted) which is positioned below the transport chamber 152. The chuck assembly 154 has a first chuck 160 and a second chuck 162 mounted thereon. The chucks 160 and 162 are configured to receive a substrate 12. The chucks 160 and 162 can be provided with a preheating and clamping element and can be used within the processing chambers without the need for unloading the substrate from the chucks prior to processing of the substrate.

The chuck assembly 154 is movably configured to provide for the transfer of the substrates 12 between the transfer chamber 120 and the processing chamber 164. In the preferred embodiment the chuck assembly 154 is housed within a transport chamber 152 having a first portion or opening 165 configured to be connected to the processing chamber 164 and a second portion or opening 167 configured to be connected to the transfer chamber 120. In the embodiment depicted in FIGS. 1A and 1B, there exists a processing position 166 and a substrate exchange position 168. When a chuck is positioned at the first position 165, the substrate 12 is located in the processing position 166 and the substrate 12 is sealed via gaskets 163 within the processing chamber 164 such that the substrate 12 can be processed within the controlled environment of the interior of the processing chamber 164. When a chuck is positioned at the second position 167, the substrate 12 is located in the substrate exchange position 168 and the substrate 12 is sealed via gaskets 163 within the transfer chamber 120 such that the substrate 12 can be loaded or unloaded from the chuck by the transfer arm 122. In the embodiment depicted in FIGS. 1A and 1B the chuck assembly 154 is configured such that when one of the chucks is in the processing position 166 another one of the plurality of chucks is in the substrate exchange position 168. In order to transfer a substrate from the substrate exchange position 168 to the processing position 166, or vice versa, the chuck assembly 154 is vertically lowered from the elevated position to the lower position, the chuck assembly 154 is rotated 180 degrees, and the chuck assembly is vertically raised from the lower position to the elevated position.

As will be readily apparent to one of skill in the art, the chuck assembly can be constructed in a variety of configurations to achieve a variety of motions of the chucks, as long as the chucks are provided with the necessary motion between the substrate exchange positions and the processing positions. For example, the chucks can be movably mounted on the base. Alternatively, the chucks can be mounted such that they can move in relation to one another either upon the base or the base can be replaced with arms, articulated or otherwise, that provide for the motion of the chucks. Additionally, the chuck transport system of the present invention can be constructed without a transport chamber. It should be noted that the exemplary embodiments depicted and described herein set forth the preferred embodiments of the present invention, and are not meant to limit the scope of the claims hereto in any way.

The embodiment depicted in FIGS. 1A and 1B includes a second chuck transport system 170 that can be operated simultaneously with the operation of the first chuck transport system 150. The second chuck transport system 170 includes a chuck assembly 174 supported within a transport chamber 172 by a shaft 178. The chuck assembly 174 is rotatably supported within the transport chamber 172 by shaft 178, and the shaft 178 is also slidably mounted such that the chuck assembly 174 can be linearly actuated in a vertical manner within the transport chamber 172. The chuck assembly 174 has a first chuck 180 and a second chuck 182 mounted thereon. The chucks 180 and 182 are configured to receive a substrate 12. In a manner similar to that of the first chuck transport system 150, when a chuck in the second transport system 170 is located in a processing position 186 the substrate 12 is sealed within the processing chamber 184, and when a chuck is positioned in the substrate exchange position 188 the substrate 12 is sealed within the transfer chamber 120.

The transfer arm 122 can be used to supply and retrieve substrates 12 between the first and second cassette platforms 130 and 140 and both the substrate exchange position 168 of the first chuck transport system 150 and the substrate exchange position 188 of the second chuck transport system 170.

The present invention includes a method for transporting a plurality of substrates between a transfer chamber and at least one processing chamber. The method of the present invention can be easily understood with reference to the embodiment that is depicted in FIGS. 1A and 1B. The method includes the steps of receiving in a first chuck 160 on a chuck assembly 154 a first one of the plurality of substrates 12 from a cassette 134 within the transfer chamber 120 when the first chuck 160 is in a substrate exchange position 168 (note the first chuck 160 is not depicted in this position); transporting the first one of the plurality of substrates 12 from the transfer chamber 120 to the at least one processing chamber 164 by moving the first chuck 160 from the substrate exchange position 168 to a processing position 166 (the first chuck 160 is depicted in this position in FIG. 1B); and receiving in a second chuck 162 on the chuck assembly 154 a second one of the plurality of substrates 12 from the cassette 134 within the transfer chamber 120 when the second chuck 162 is in the substrate exchange position 168. The substrate within the processing chamber 164 can be processed while the second chuck 162 is loaded with a substrate, and the positions of the first and second chucks 160 and 162 can be exchanged upon completion of the processing of the substrate on the first chuck 160. The substrate of the second chuck 162 can then be processed within the processing chamber 164, while the substrate on the first chuck 160 is unloaded and a new substrate is loaded on the first chuck 160. This process can be repeated as needed.

The present invention can be constructed to include an intermediate chamber that can be used to perform various pre- or post-processing steps to the substrate. For example, the intermediate chamber can be utilized to preheat the substrate, to clean the substrate either before or after processing in the processing chamber(s), to act as a purge chamber, to act as a processing chamber, to act as a post-etch passivation chamber, etc. Any processing that takes place within the intermediate chamber can be performed simultaneously with processing occurring in the processing chamber, thereby increasing throughput of the system. FIGS. 2–5 depict several exemplary embodiments of such an intermediate chamber. As will be readily apparent to one of skill in the art, the intermediate chamber can be readily modified to suit a particular processing need. The intermediate chamber of the present invention is not limited to the specific embodiments described herein.

Figure 2:
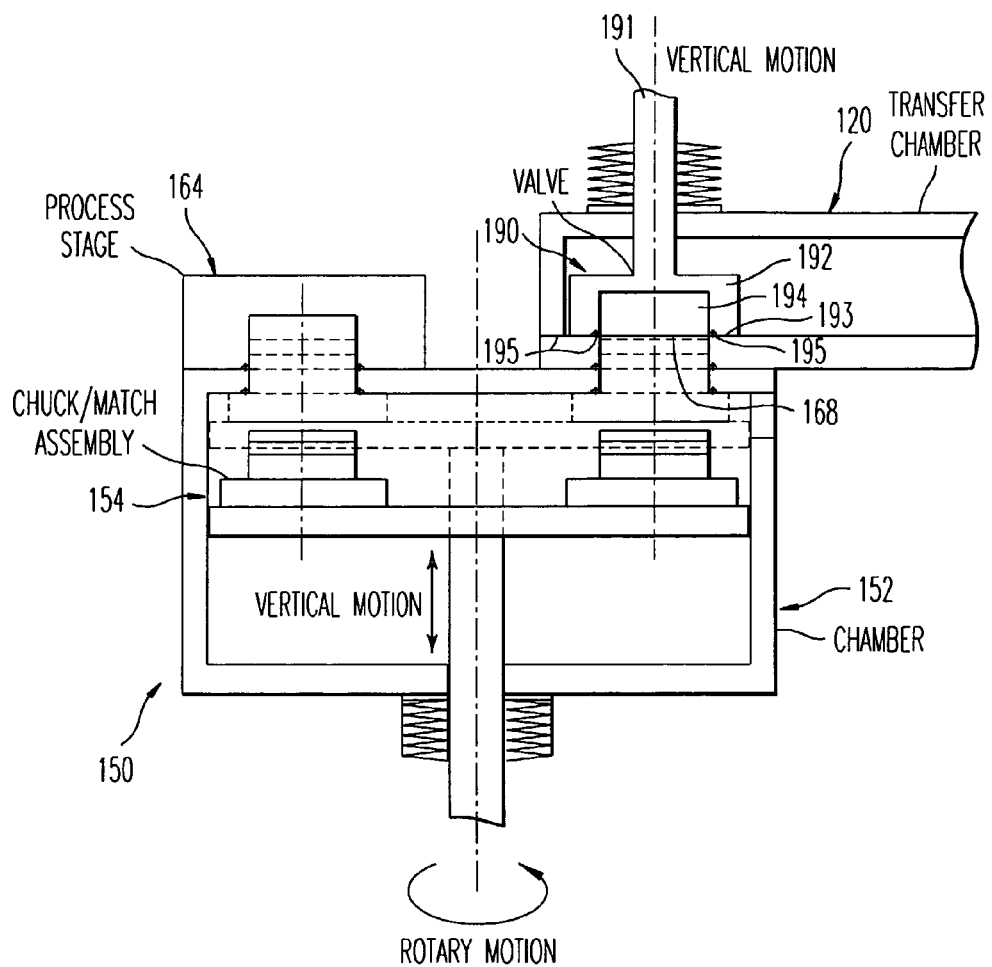
FIG. 2 is a cross-sectional view of a second embodiment of a chuck transport system of the present invention.

A second embodiment of the chuck transport system according to the present invention is depicted in FIG. 2. A description of those items that are the same as in FIGS. 1A and 1B has been omitted so as to accentuate only the changes. The chuck transport system 150 further includes an intermediate chamber 194 located at or adjacent the substrate exchange position 168. The chuck assembly 154 and a portion of the transfer chamber 120 define the intermediate chamber 194. In this particular embodiment the intermediate chamber 194 is defined by a valve 190 that is slidably mounted within the transfer chamber 120 above the substrate exchange position 168 such that the valve 190 can be vertically, linearly actuated. The valve 190 can be moved vertically upward to allow for the transfer arm to load or unload a substrate from the chuck in the substrate exchange position 168, and can be moved vertically downward to seal the intermediate chamber 194 shut. (This vertical motion also reduces particulate generation on the gaskets as compared to a horizontal sliding.) The valve 190 includes a shaft 191 and a hollow chamber portion or interface plate 192 that has an interior that defines part of the intermediate chamber 194 and an end 193 that abuts the transfer chamber 120 about the perimeter of the substrate exchange position 168. Gaskets 195 are provided on the end 193 of the valve 190 in order to create a seal. When the chuck assembly 154 is moved to an elevated position such that one of the chucks and the substrate 12 are in the substrate exchange position 168 and the valve 190 is lowered, the intermediate chamber 194 is formed and is defined by the hollow chamber portion (or interface plate) 192 of the valve 190 and the chuck of the chuck assembly 154.

The intermediate chamber 194 can be used to inject or evacuate gases surrounding the substrate 12 in the substrate exchange position 168. The intermediate chamber 194 is generally configured to have a small internal volume, which allows the intermediate chamber 194 to be purged quickly and to change pressure in a short period of time. The interface plate 192 can be configured with pumping and gas flow channels to enable purging of the small volume within the intermediate chamber 194 immediately after wafer exchange and immediately prior to wafer transfer back to the cassette or to the next process. This ability to change pressure quickly enables the transport chamber 152 to be held at a much different pressure than the transfer chamber 120. Additionally, the small volume within the intermediate chamber 194 allows for a strong purge flow stream that can effectively remove adsorbed contaminates and provide a flow of particulate free gas to minimize particulates on the wafer. This can be used to protect the transfer room from contamination by process residuals, protect a delicate process from contamination by adsorbed wafer products, or allow the process chambers of radically different pressure to be effectively integrated on the same of transfer chamber.

Figure 3:
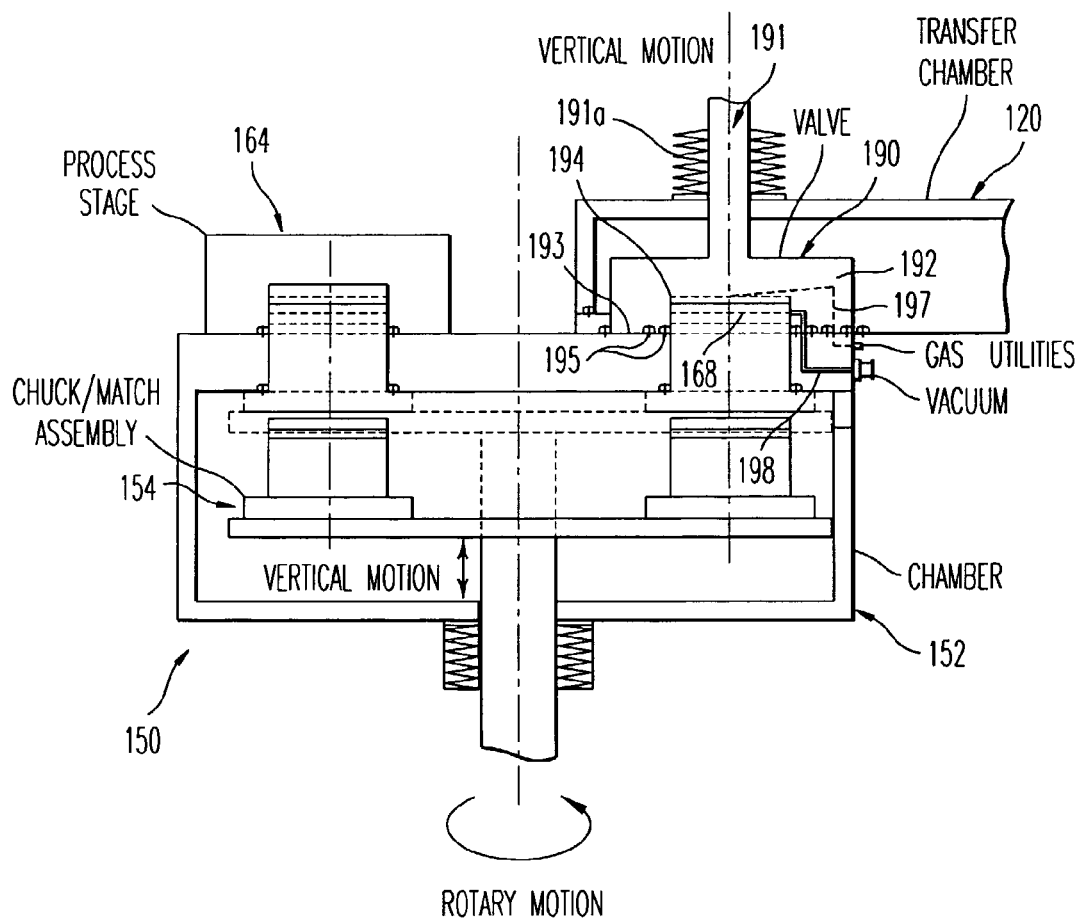
FIG. 3 is a cross-sectional view of a third embodiment of a chuck transport system of the present invention.

A third embodiment of the chuck transport system according to the present invention is depicted in FIG. 3. A description of those items that are the same as in FIGS. 1A and 1B has been omitted so as to accentuate only the changes.

In the third embodiment, the intermediate chamber 194 has a gas supply line 197 and a vacuum line 198 that extend through the top of the transport chamber 152 and through the interface plate 192, which can be used to inject or evacuate gases surrounding the substrate 12 in the substrate exchange position 168. The intermediate chamber 194 of the third embodiment can be utilized to provide various processing steps, such as pre-cleaning of the wafer or post-etch passivation of the wafer.

Figure 4:
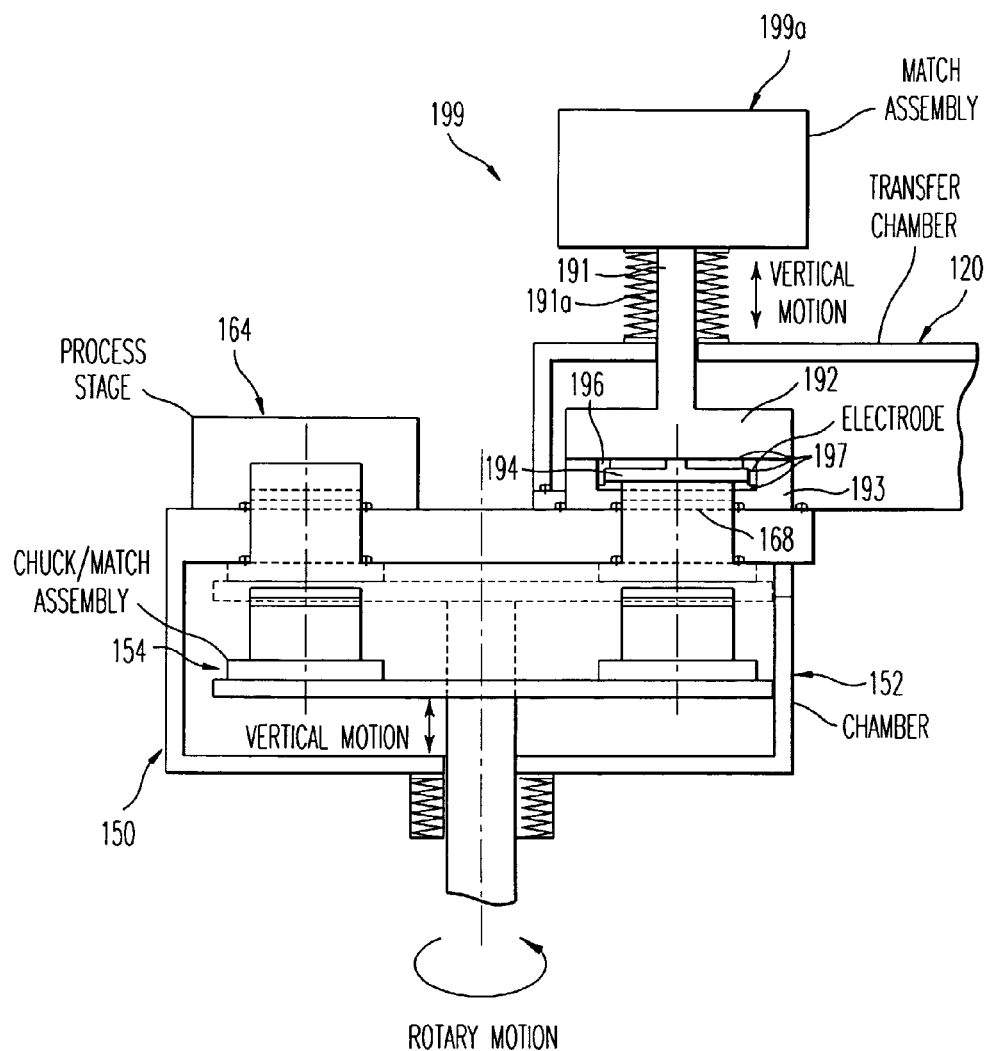
FIG. 4 is a cross-sectional view of a fourth embodiment of a chuck transport system of the present invention.

A fourth embodiment of the chuck transport system according to the present invention is depicted in FIG. 4. A description of those items that are the same as in FIGS. 1A and 1B has been omitted so as to accentuate only the changes. The fourth embodiment includes a valve assembly 199 that includes a shaft 191 and a chamber portion or interface plate 192 that has a lower surface that defines part of the intermediate chamber 194 and abuts a top surface of a valve seat 193 that extends upward from the transport chamber 152 about the perimeter of the substrate exchange position 168. When the chuck assembly 154 is moved to an elevated position such that one of the chucks and the substrate 12 are in the substrate exchange position 168 and the valve of the valve assembly 199 is lowered, the intermediate chamber 194 is formed and is defined by the chamber portion 192 of the valve assembly 199 and the chuck of the chuck assembly 154. The valve assembly 199 of the fourth embodiment includes an electrode 196 (electrically insulated from chamber portion 192 and valve seat by dielectric material 197) positioned above the intermediate chamber 194 and driven with RF power through match network 199a housed within valve assembly 199 to produce plasma that can aid in the processing of the substrate. The RF (feed) connection to electrode 196 is made through shaft 191 from match assembly 199a. Bellows 191a are implemented to insure the vacuum integrity of transfer chamber 120.

Figure 5:
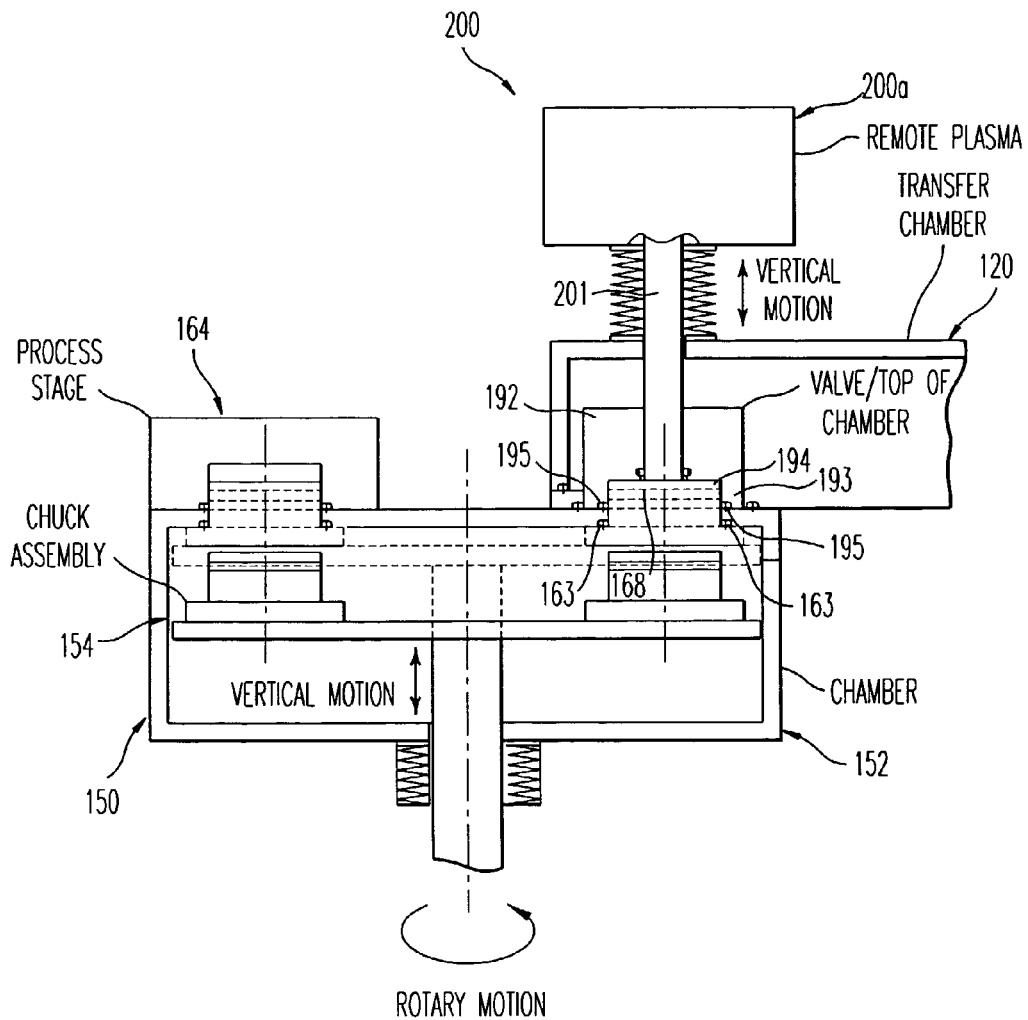
FIG. 5 is a cross-sectional view of a fifth embodiment of a chuck transport system of the present invention.

A fifth embodiment of the chuck transport system according to the present invention is depicted in FIG. 5. A description of those items that are the same as in FIGS. 1A and 1B has been omitted so as to accentuate only the changes. The fifth embodiment includes the intermediate chamber 194 that is defined by a valve assembly 200 that is slidably mounted within the transfer chamber 120 above the substrate exchange position 168 such that the valve of the valve assembly 200 can be vertically, linearly actuated. The valve of the valve assembly 200 includes a hollow shaft 201 having a passage therethrough and a hollow chamber portion or interface plate 192 that has an interior that defines part of the intermediate chamber 194 and an end 193 that abuts the top surface of the transport chamber 152 about the perimeter of the substrate exchange position 168. The valve assembly 200 of the fifth embodiment includes a passage through the hollow shaft 201 that provides for remote plasma processing within the intermediate chamber 194 controlled by the valve assembly 200, wherein valve assembly 200 houses a plasma generating chamber 200a. Plasma from the plasma generating chamber 200a diffuses downstream through duct 201 to processing region 194 proximate to wafer 12.

In its most basic form, the present invention includes a single chuck transport system having a chuck assembly with two chucks thereon, where the chuck transport system is configured to transport a substrate to a processing chamber. As will be readily apparent to one of skill in the art, the present invention can be constructed to include a wide variety of alternative configurations modified from this basic form. For example, the embodiment depicted in FIG. 1A includes two chuck transport systems each having a chuck assembly with two chucks thereon. Another alternative embodiment is depicted in FIG. 6, which depicts a substrate processing system 600 that includes a first chuck transport system 640, a second chuck transport system 660, and a third chuck transport system 680, which each have a chuck assembly with three chucks thereon.

Figure 6:
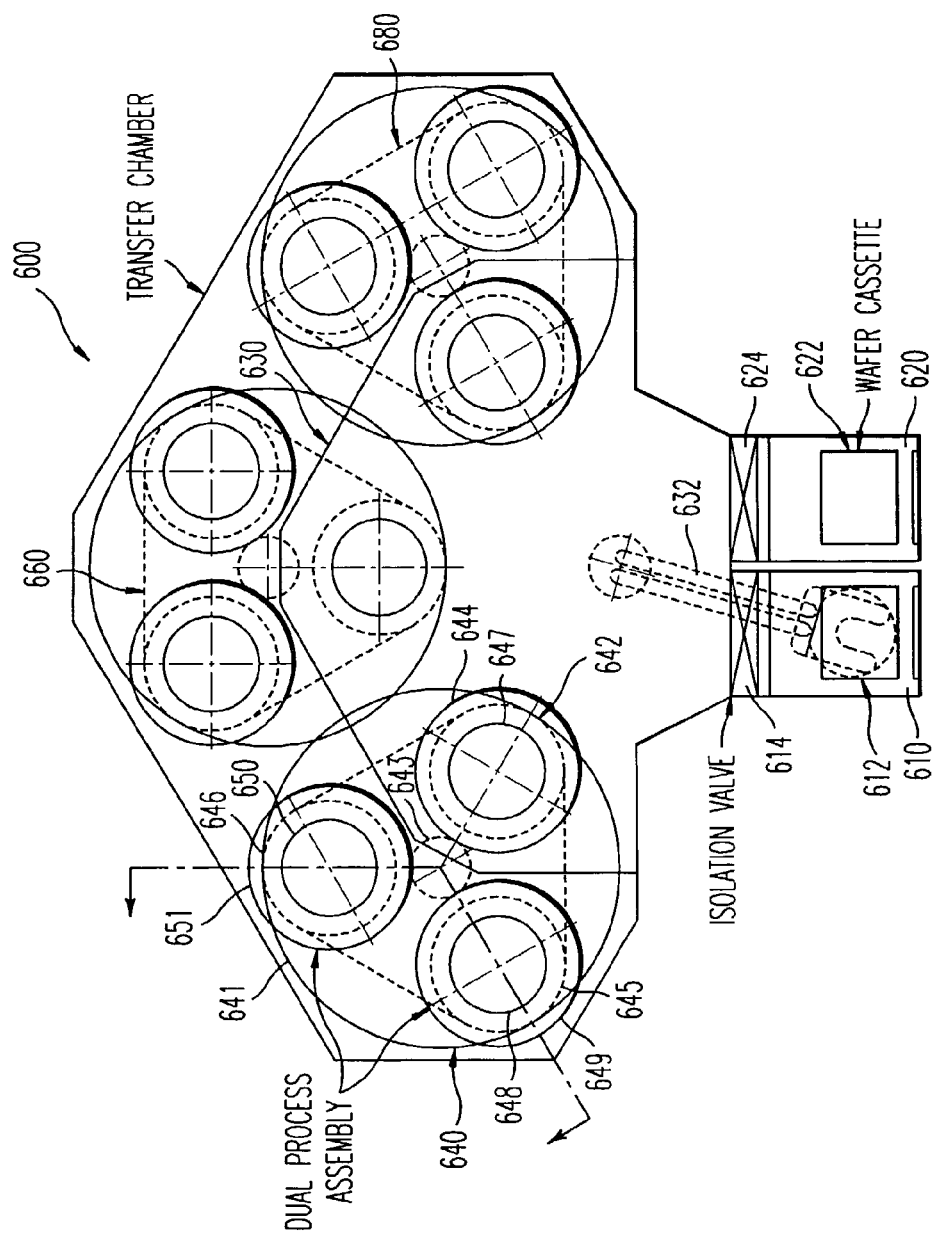
FIG. 6 is a top view of a substrate processing system incorporating a sixth embodiment of a chuck transport system of the present invention.

The sixth embodiment depicted in FIG. 6 includes a substrate processing system 600 having a first cassette platform 610 and the second cassette platform 620 that allow wafer cassettes 612 and 622 to be inserted and temporarily stored or housed therein. The first cassette platform 610 and the second cassette platform 620 have isolation valves 614 and 624, respectively, that separate the first and second cassette platforms 610 and 620 from a transfer chamber 630. The system 600 further includes a robotic transfer arm 632 pivotally provided in the transfer chamber 630. The transfer arm 632 is configured to engage and carry a wafer substrate 12 between the cassette platforms 610 and 620 and the chuck transport systems 640, 660, and 680.

The chuck transport system 640 includes a chuck assembly 642 supported on a shaft 643 within a transport chamber 641, which is connected to the transfer chamber 630, a first processing chamber 649 and a second processing chamber 651. The chuck assembly 642 has a first chuck 644, a second chuck 645, and a third chuck 646 mounted thereon. The chucks 644, 645, and 646 are configured to receive a substrate 12. In the chuck transport system 640, when a chuck is located in a first processing position 648 the substrate 12 is sealed within the first processing chamber 649, when a chuck is located in a second processing position 650 the substrate in located in a second processing chamber 651, and when a chuck is positioned in the substrate exchange position 647 the substrate 12 is sealed within the transfer chamber 630.

The substrate processing system 600 depicted in FIG. 6 further includes a second chuck transport system 660 and a third chuck transport system 680, which are similar to the first chuck transport system 640 described above. Each of the chuck transport systems can be constructed with different configurations (different numbers of chucks, different numbers and types of processing chambers, etc.), depending upon the processing steps being performed at the processing chambers connected to the chuck transport system, or the chuck transport systems can simultaneously be performing the same processing steps using identical configurations. Note also that the chuck transport systems can be operated in series with each substrate travelling through each of the systems in sequence, or in parallel with several substrates being completely and simultaneously processed within a single chuck transport system and its corresponding processing chambers.

Figure 7:
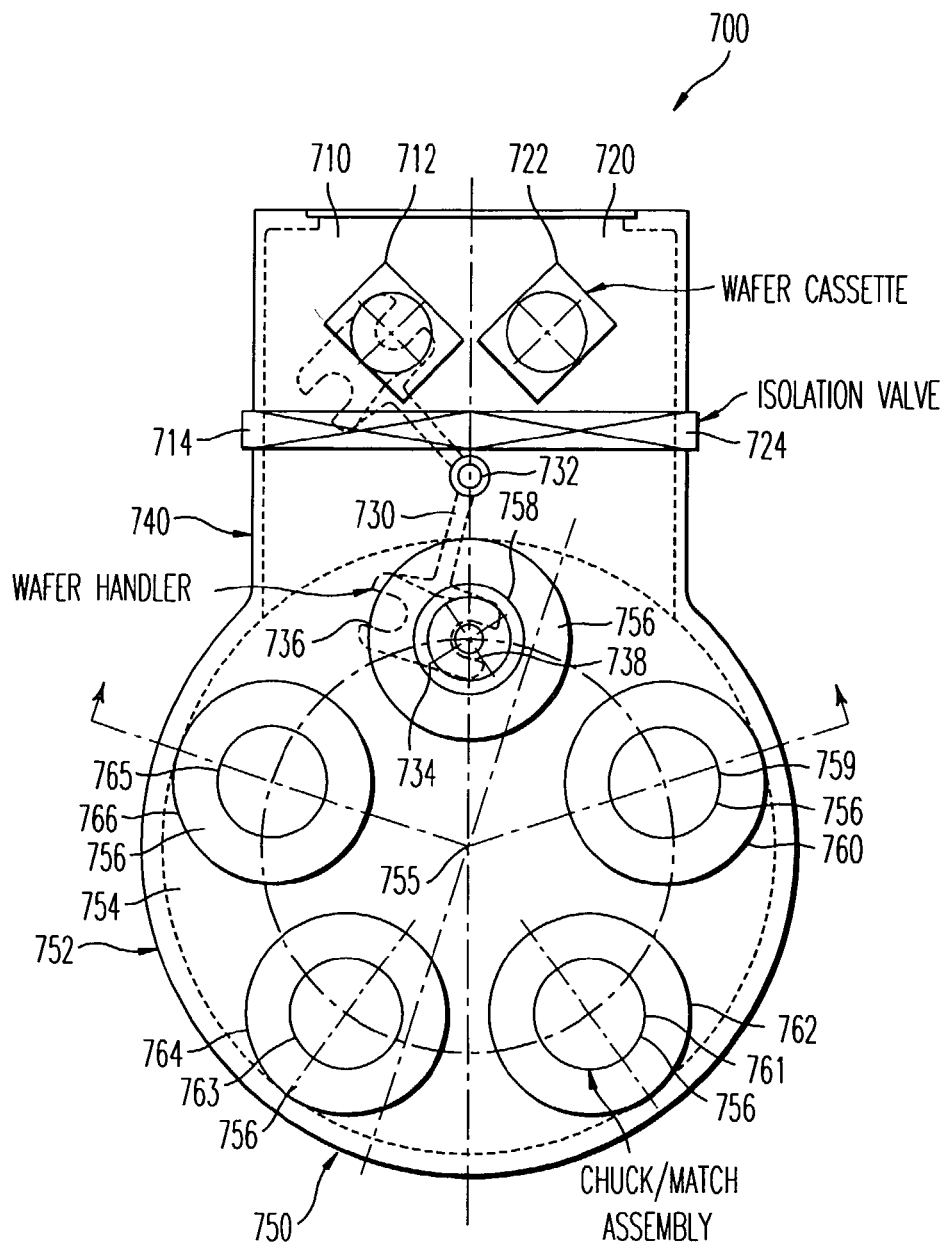
FIG. 7 is a top view of a substrate processing system incorporating a seventh embodiment of a chuck transport system of the present invention.

The sixth embodiment includes chuck transport systems 640, 660, and 680 each having a grouping of three chucks in an array. The array can be rotated and moved vertically in unison upon the chuck assembly. This configuration allows one chuck to be positioned within a process chamber and a second chuck to be positioned within a pre- or post-processing chamber, or second processing chamber, while the third chuck to be positioned in wafer transfer chamber for loading, unloading, clamping, unclamping, heating, cooling, etc. This configuration is most effective when the time for pre- or post-processing is about equal to the time to process the wafer and the time to exchange wafers. This configuration like those described above is capable of some pre-processing or pre-cleaning in the substrate exchange position through the incorporation of an intermediate chamber. Also robots can be multi bladed as is known to increase the robot efficiency. Also multiple robots can be used to transfer wafers to and from cassettes at multiple stations A seventh embodiment is depicted in FIG. 7. The seventh embodiment is a substrate processing system 700 that includes a chuck transport system 750 having a chuck assembly 754 housed within a transport chamber 752 with five chucks 756 thereon. The chuck assembly 754 is rotatably supported within the transport chamber 752 by a shaft (not depicted) about axis 755, and the shaft is also slidably mounted such that the chuck assembly 754 can be linearly actuated in a vertical manner within the transport chamber 752. The five chucks 756 are configured to receive a substrate 12. The seventh embodiment includes a substrate exchange position 758, a first processing position 759 adjacent processing chamber 760, a second processing position 761 adjacent processing chamber 762, a third processing position 763 adjacent processing chamber 764, and a fourth processing position 765 adjacent processing chamber 766.

The seventh embodiment includes a substrate processing system 700 having a first cassette platform 710 and the second cassette platform 720 that allow wafer cassettes 712 and 722 to be inserted and temporarily stored or housed therein. The first cassette platform 710 and the second cassette platform 720 have isolation valves 714 and 724, respectively, that separate the first and second cassette platforms 710 and 720 from the transfer chamber 740. The system 700 further includes a robotic transfer arm 730 pivotally provided in the transfer chamber 740 about axis 732. The transfer arm 730 is configured to engage and carry a wafer substrate 12 between the cassette platforms 710 and 720 and the chuck transport system 750. The transfer arm 730 includes a head 734 with a first end 736 and an oppositely facing second end 738 that can be used to carry substrates from cassette platforms 710 and 720, respectively.

The seventh embodiment provides a chuck transport system and transport chamber where the substrate can proceed directly from one processing chamber to the next without loading and unloading the substrate from a chuck, as in a system configuration having a series of chuck transport systems with corresponding processing chambers. The seventh embodiment provides a system in which the substrate can be processed very quickly. Note that several of the chuck transport systems such as that described for the seventh embodiment can be operated in parallel or in series.

Figure 8A:
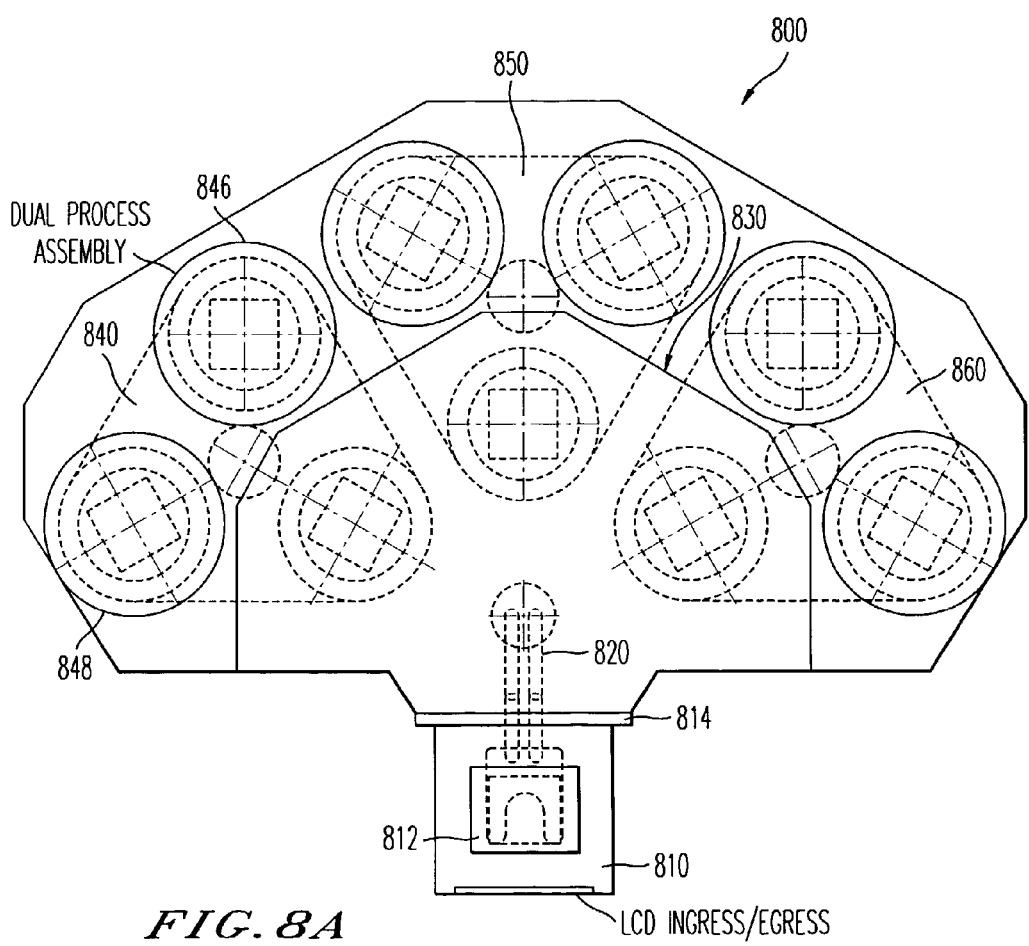
FIG. 8A is a top view of a substrate processing system incorporating an eighth embodiment of a chuck transport system of the present invention.
Figure 8B:
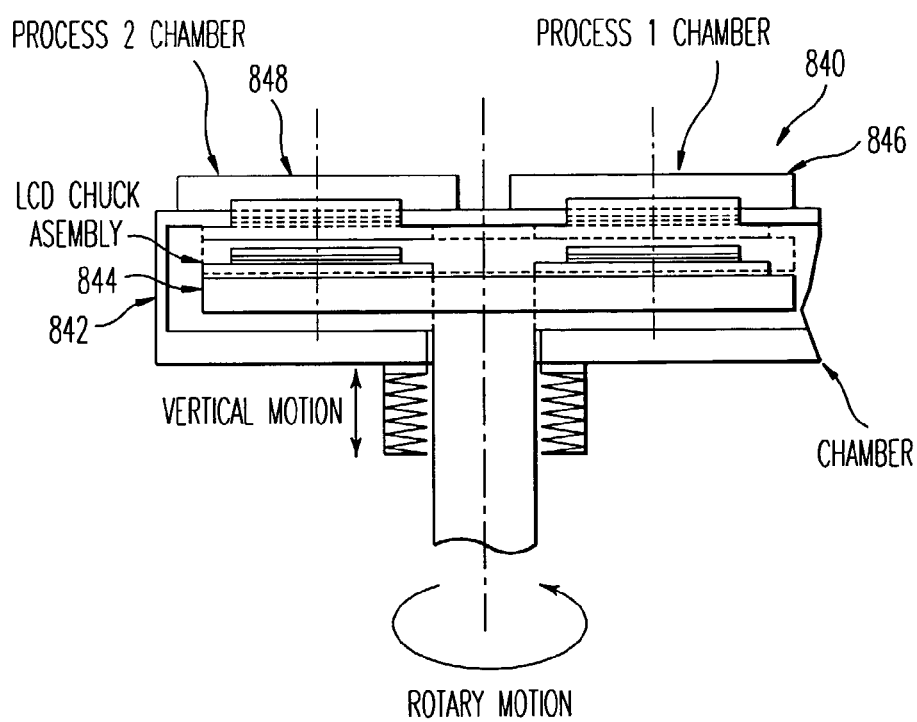
FIG. 8B is a cross-sectional view of the eighth embodiment of the chuck transport system of FIG. 8A.

FIGS. 8A and 8B depict an eighth embodiment that has a configuration that is similar to the sixth embodiment of FIG. 6. The eighth embodiment, however, has been modified to accommodate liquid crystal display (LCD) substrates, which are generally square in shape and can measure 1 meter across a side.

The eighth embodiment is a substrate processing system 800 that includes a first chuck transport system 840, a second chuck transport system 850, and a third chuck transport system 860, which each have a chuck assembly with three chucks thereon. The system 800 includes an LCD substrate cassette platform 810 that allows a cassette 812 to be inserted and temporarily stored or housed therein. The cassette platform 810 also has an isolation valve 814 that separates the cassette platform 810 from a transfer chamber 830. The system 800 further includes a robotic transfer arm 820 pivotally provided in the transfer chamber 830 that is configured to engage and carry a substrate between the cassette platform 810 and the chuck transport systems 840, 850, and 860.

The chuck transport system 840, depicted in FIG. 8B, includes a chuck assembly 844 rotatably supported within a transport chamber 842 by a shaft, and the shaft is also slidably mounted such that the chuck assembly 844 can be linearly actuated in a vertical manner within the transport chamber 842. The transport chamber 842 is connected to a first processing chamber 846 and a second processing chamber 848.

The advantageous benefits of the present invention can be seen by comparing a hypothetical system not employing the present invention to a system employing the present invention. Such an analysis is set forth below.

As discussed briefly above, commercial processing systems are very expensive. As a result, to recoup the investment in those systems, system users attempt to process as many wafers per system per day as possible. An example of a cycle of unloading and loading a wafer substrate might include the following steps that are performed in the following time periods:

(a) purge a processing chamber of process gases (15 seconds);

(b) lower a chuck to an exchange position and remove electrostatic voltage (7 seconds);

(c) lift a wafer from the chuck using pins (5 seconds);

(d) equilibrate pressure within the processing chamber with pressure in a transfer chamber, which is isolated from the processing chamber by a isolation valve (15 seconds);

(e) insert a blade of a robot under the wafer (5 seconds);

(f) transfer the wafer to the blade (5 seconds);

(g) remove the wafer from the processing chamber on the blade (15 seconds);

(h) place the wafer in a cassette or on a holding stage (10 seconds);

(i) index the cassette to a new wafer (5 seconds);

(j) remove the new wafer from the cassette and place above the chuck (15 seconds);

(k) transfer the new wafer to the pins (5 seconds);

(l) lower the new wafer onto the chuck (3 seconds);

(m) withdraw the robot from the processing chamber (5 seconds);

(n) close the gate valve and raise the chuck (3 seconds); and (o) stabilize the pressure within the processing chamber and flow stream of process (15 seconds).

The total time of the above steps is 128 seconds. A typical process time might fall within the range between 60 and 300 seconds.

In the above cycle the processing chamber must be purged because of concerns about waste process gas contamination of the incoming wafers and the contamination mostly of water vapor on the incoming wafers. Waste process gas is often partially organic in content, which increases the adsorption of water vapor or other contamination onto the surface of the wafer substrate. Later these surfaces desorb the contamination onto a wafer entering the processing chamber or onto wafers exiting the processing chamber. The purging takes time and is never one hundred percent effective. Any time sequence is a compromise of nonproductive time of the processing chamber and the completeness of purging.

The present invention advantageously uses a plurality of chucks that can be transported to one or more processing chambers. For example, as discussed above, FIGS. 1A and 1B depict a substrate processing system 100 with two chuck transport systems 150 and 170 each having two chucks 160/162 and 180/182, respectively, that provide access to two processing chambers 164 and 184, respectively. Within each of the chuck transport systems, a first chuck is located at a processing position inside the processing chamber and a second chuck is located at a substrate exchange position inside the transfer room or transfer chamber. The first chuck outside the processing chamber is processed through steps (b), (c), and (e) through (m) as set forth below:

(b) lower a chuck to an exchange position and remove electrostatic voltage (7 seconds);
(c) lift a wafer from the chuck using pins (5 seconds);
(e) insert a blade of a robot under the wafer (5 seconds);
(f) transfer the wafer to the blade (5 seconds);
(g) remove the wafer from the processing chamber on the blade (15 seconds);
(h) place the wafer in a cassette or on a holding stage (10 seconds);
(i) index the cassette to a new wafer (5 seconds);
(j) remove the new wafer from the cassette and place above the chuck (15 seconds);
(k) transfer the new wafer to the pins (5 seconds);
(l) lower the new wafer onto the chuck (3 seconds); and
(m) withdraw the robot from the processing chamber (5 seconds).

The total time of the above steps is 80 seconds. Note the total time savings from skipping steps (a), (d), (n), and (o) is 48 seconds. The first and second chucks are then exchanged and processing resumes. In this configuration a step of exchanging the chucks is added, which adds an additional 5 seconds, thereby making the total time 85 seconds.

Assuming a processing time of 60 seconds within an inherently high processing rate chamber, the configuration of the present invention set forth above increases the throughput substantially. The total time of the system that does not include exchanging chucks (which performs steps (a) through (o)) is 188.0 seconds, while the total time for the system that includes exchanging chucks (steps (b), (c), and (e) through (m) are performed while processing the substrate) is 113.0 seconds. The throughput of the system without exchanging chucks expressed in wafers per hour is therefore 19.1, while the throughput of the system with exchanging chucks is 31.9, which is an increase of 66.4% over the throughput of the system without exchanging chucks. Assuming that the addition of the structure necessary to implement the system with exchanging chucks creates an overall increase in the cost of the hardware of the system of 27.3%, the wafer processing costs are reduced by 23.5%. In other words, the wafer processing costs of the system with exchanging chucks are 76.5% of the wafer processing costs of the system without exchanging chucks.

The savings impact of this configuration is further increased if we consider the situation where the processing time becomes shorter than 60 seconds, for example 30 seconds. In this situation, the total time of the system that does not include exchanging chucks is 158.0 seconds, while the total time for the system that includes exchanging chucks is 83.0 seconds. The throughput of the system without exchanging chucks expressed in wafers per hour is therefore 22.8, while the throughput of the system with exchanging chucks is 43.4, which is an increase of 90.4% over the throughput of the system without exchanging chucks. Assuming that the addition of the structure necessary to implement the system with exchanging chucks creates an overall increase in the cost of the hardware of the system of 27.3%, the wafer processing costs are reduced by 33.2%. In other words, the wafer processing costs of the system with exchanging chucks are 66.8% the wafer processing costs of the system without exchanging chucks.

Numerous modifications and variations of the present invention are possible in light of the above teachings. It is therefore to be understood that, within the scope of the appended claims, the invention may be practiced otherwise than as specifically described herein.

The invention claimed is:

1. A substrate processing system comprising:
   a transfer chamber forming an enclosed volume having therein a transfer arm configured to transfer a substrate;
   a processing chamber separate from said transfer chamber;
   a chuck assembly with a plurality of chucks configured to receive the substrate, said chuck assembly being movably configured to provide for transfer of the substrate between said transfer chamber and said processing chamber such that when one of said plurality of chucks is in a processing position within said processing chamber another one of said plurality of chucks is in a substrate exchange position within said transfer chamber; and
   a valve movably mounted within said enclosed volume of the transfer chamber and configured to form a separately sealed intermediate chamber within said enclosed volume of the transfer chamber such that another substrate on said another one of said plurality of chucks can be processed while located at said substrate exchange position.

2. The system according to claim 1, wherein said chuck assembly is movably configured to perform vertical linear movement and axial rotation.

3. The system according to claim 1, wherein said intermediate chamber is defined by said chuck assembly and the transfer chamber.

4. The chuck transport system according to claim 1, wherein said intermediate chamber is defined by one of said plurality of chucks and said valve.

5. The system according to claim 1, wherein said valve comprises an interface plate and a valve seat.

6. The system according to claim 5, wherein said valve further comprises an electrode driven with RF power to produce plasma.

7. The system according to claim 5, wherein said valve includes a shaft having a passage there through that provides for remote plasma processing.

8. The system according to claim 1, wherein said intermediate chamber includes gas flow channels.

9. The system according to claim 1, wherein said chuck assembly has three chucks configured to receive the substrate, said chuck assembly being movably configured to provide for transfer of the substrate between the transfer chamber, the processing chamber, and an additional processing chamber.

10. The system according to claim 9, wherein said chuck assembly is housed within a chamber, said chamber having a first portion configured to be connected to the processing chamber, a second portion configured to be connected to the transfer chamber, and a third portion configured to be connected to the additional chamber, said chuck assembly being movably configured within the chamber to provide for the transfer of said chucks between said first portion, said second portion, and said third portion.

11. The substrate processing system according to claim 1, wherein said chuck assembly is housed within a chamber, said chamber having a first portion connected to said processing chamber and a second portion connected to said transfer chamber, said chuck assembly being movably configured within said chamber to provide for transfer of said plurality of chucks between said first portion and said second portion.

12. A method for transporting a plurality of substrates between a transfer chamber forming an enclosed volume and at least one separate processing chamber, said method comprising the steps of:
   receiving in a first chuck on a chuck assembly a first one of the plurality of substrates from a cassette within the enclosed volume of the transfer chamber when the first chuck is in a substrate exchange position;
   transporting the first one of the plurality of substrates from the transfer chamber to the at least one processing chamber by moving the first chuck from the substrate exchange position to a processing position;
   receiving in a second chuck on the chuck assembly a second one of the plurality of substrates from the cassette within the enclosed volume of the transfer chamber when the second chuck is in the substrate exchange position; and
   positioning a valve within the enclosed volume of the transfer chamber to form a separately sealed intermediate chamber sealed within the enclosed volume of the transfer chamber and around said second one of the plurality of substrates; and
   performing a processing step within an said intermediate chamber when one of the plurality of substrates is in the substrate exchange position.

13. The method according to claim 12, further comprising, substantially simultaneously, the steps of:
   transporting the first one of the plurality of substrates from the at least one processing chamber to the transfer chamber by moving the first chuck from the processing position to the substrate exchange position; and
   transporting the second one of the plurality of substrates from the transfer chamber to the at least one processing chamber by moving the second chuck from the substrate exchange position to the processing position.

14. The method according to claim 12, further comprising, substantially simultaneously, the steps of:
   transporting the first one of the plurality of substrates from the at least one processing chamber to an additional processing chamber by moving the first chuck from the processing position to a second processing position; and
   transporting the second one of the plurality of substrates from the transfer chamber to the at least one processing chamber by moving the second chuck from the substrate exchange position to the processing position;
   the method thereafter comprising the step of receiving in a third chuck on the chuck assembly a third one of the plurality of substrates from the cassette within the transfer chamber when the third chuck is in the substrate exchange position.

15. The method according to claim 12, wherein the first one of the plurality of substrates remains on the first chuck during the processing of the first one of the plurality of substrates and the second one of the plurality of substrates remains on the second chuck during the processing of the second one of the plurality of substrates.

16. The method according to claim 12, wherein the method of transporting comprises moving the first chuck on bellows sealed arms, thereby enabling random motion.

* * * * *